US007351510B2

(12) United States Patent
Shirai et al.

(10) Patent No.: US 7,351,510 B2

(45) Date of Patent: Apr. 1, 2008

(54) TONER FOR ELECTROPHOTOGRAPHY

(75) Inventors: Eiji Shirai, Wakayama (JP); Tetsuya Ueno, Wakayama (JP); Yasunori Inagaki, Wakayama (JP)

(73) Assignee: Kao Corporation, Tokyo (JP)

( * ) Notice: Subject to any disclaimer, the term of this patent is extended or adjusted under 35 U.S.C. 154(b) by 440 days.

(21) Appl. No.: 11/010,261

(22) Filed: Dec. 14, 2004

(65) Prior Publication Data

US 2005/0147911 A1 Jul. 7, 2005

(30) Foreign Application Priority Data

Jan. 6, 2004 (JP) ............................ 2004-001386

(51) Int. Cl.
*G03F 9/087* (2006.01)

(52) U.S. Cl. .................................................... 430/109.4

(58) Field of Classification Search .............. 430/109.4
See application file for complete search history.

(56) References Cited

U.S. PATENT DOCUMENTS 5,660,963 A * 8/1997 Doujo et al. ............. 430/109.4
5,853,942 A * 12/1998 Lin ......................... 430/137.1
6,506,530 B1 * 1/2003 Kido et al. .............. 430/108.8
6,514,653 B1 * 2/2003 Tavernier et al. ........ 430/109.4
6,541,173 B1 * 4/2003 Kido et al. .............. 430/109.4
2003/0040554 A1 * 2/2003 Nakanishi et al. .......... 523/221
2003/0073018 A1 * 4/2003 Tachi et al. .............. 430/108.6
2003/0104301 A1 6/2003 Ueno et al.
2003/0165760 A1 * 9/2003 Higuchi et al. .......... 430/108.4
2005/0064313 A1 * 3/2005 Kishiki et al. ........... 430/109.2
2005/0147911 A1 7/2005 Shirai et al.

OTHER PUBLICATIONS

Patent Abstracts of Japan, JP 2003-119351, Apr. 23, 2003, corr. US 2003/0104301 A1.
Patent Abstracts of Japan, JP 2001-296689, Oct. 26, 2001.
Patent Abstracts of Japan, JP 4-124681, Apr. 24, 1992.
Patent Abstracts of Japan, JP 5-134454, May 28, 1993.
U.S. Appl. No. 11,578,292, filed Oct. 13, 2006, Shirai.
U.S. Appl. No. 11/095,595, filed Apr. 1, 2005, Shirai, et al.
U.S. Appl. No. 11/095,593, filed Apr. 1, 2005, Shirai.
U.S. Appl. No. 11/010,261, filed Dec. 14, 2004, Shirai, et al.

* cited by examiner

*Primary Examiner*—Hoa Van Le
(74) *Attorney, Agent, or Firm*—Oblon, Spivak, McClelland, Maier & Neustadt, P.C.

(57) ABSTRACT

A toner for electrophotography, containing a low-softening point polyester-based resin having a softening point of from 80° to 120° C.; and a high-softening point polyester-based resin having a softening point of higher than 120° C. and 160° C. or lower, wherein the low-softening point polyester-based resin has a viscosity at 160° C. of from 500 to 10000 Pa·s, and a ratio of viscosity at 140° C. to viscosity at 180° C. is 10 or less, and wherein a weight ratio of the low-softening point polyester-based resin to the high-softening point polyester-based resin is from 20/80 to 90/10. The toner for electrophotography of the present invention is used for, for instance, developing electrostatic latent images formed in electrophotography, electrostatic recording method, electrostatic printing method, and the like.

7 Claims, No Drawings

TONER FOR ELECTROPHOTOGRAPHY

FIELD OF THE INVENTION

The present invention relates to a toner for electrophotography used for, for instance, developing an electrostatic latent image formed in electrophotography, electrostatic recording method, electrostatic printing method, or the like.

BACKGROUND OF THE INVENTION

In recent years, from the viewpoint of miniaturization of machines and high printing speeds, there has been widely used a toner containing a polyester excellent-in the low-temperature fixing ability as a main component of the resin binder. Generally, the low-temperature fixing ability is improved by lowering the softening point of the resin. However, a resin having a low softening point is likely to generate offset during fixing by a heat roller fixing method. As a countermeasure for this disadvantage, there has been known a toner containing a resin binder of a combination of a low-softening point polyester and a high-softening point polyester (see Japanese Patent Laid-Open No. 2003-119351).

However, in general, resins having a low softening point have a low melt viscosity, so that homogeneous dispersion of various additives, in particular, magnetic powder, is not easily achieved, whereby triboelectric stability is insufficient. Even when such a resin is used together with a resin having a high softening point, satisfactory results have not been obtained.

On the other hand, as a means of improving dispersibility of an additive such as a magnetic powder, there have been known, for instance, a toner containing a polyester having a specified hydroxyl value and a magnetic material to which a carbon black is adsorbed on its surface (see Japanese Patent Laid-Open No. 2001-296689); a toner containing fine magnetic particles treated with a titanate coupling agent (see Japanese Patent Laid-Open No. Hei 4-124681); a toner containing a polyester obtained from specified raw material monomers and a magnetic material (see Japanese Patent Laid-Open No. Hei 5-134454); and the like. However, further improvement has been desired for satisfying both low-temperature fixing ability and triboelectric stability.

SUMMARY OF THE INVENTION

The present invention relates to:

(1) a toner for electrophotography, containing:

a low-softening point polyester-based resin having a softening point of from 80° to 120° C.; and a high-softening point polyester-based resin having a softening point of higher than 120° C. and 160° C. or lower, wherein the low-softening point polyester-based resin is a linear polyester-based resin which contains a polyester component made from a raw material monomer containing 1 to 30% by mol of a divalent aliphatic monomer, and the low-softening point polyester-based resin has a viscosity at 160° C. of from 500 to 10000 Pa·s, and a ratio of viscosity at 140° C. to viscosity at 180° C. is 10 or less, and wherein a weight ratio of the low-softening point polyester-based resin to the high-softening point polyester-based resin is from 20/80 to 90/10; and (2) a toner for electrophotography, containing:

a low-softening point polyester-based resin having a softening point of from 80° to 120° C., and a high-softening point polyester-based resin having a softening point of higher than 120° C. and 160° C. or lower, wherein the low-softening point polyester-based resin is prepared by mixing a linear polyester-based resin which contains a polyester component made from a raw material monomer containing 1% by mol or less of a divalent aliphatic monomer, with a plasticizer at 130° to 210° C., and the low-softening point polyester-based resin has a viscosity at 160° C. of from 500 to 10000 Pa·s, and a ratio of viscosity at 140° C. to viscosity at 180° C. is 10 or less, and wherein a weight ratio of the low-softening point polyester-based resin to the high-softening point polyester-based resin is from 20/80 to 90/10.

DETAILED DESCRIPTION OF THE INVENTION

The present invention relates to a toner for electrophotography, which is excellent in both of low-temperature fixing ability and triboelectric stability.

The toner for electrophotography of the present invention exhibits an excellent effect of being excellent in both of low-temperature fixing ability and triboelectric stability.

These and other advantages of the present invention will be apparent from the following description.

The present inventors have noticed that in a toner containing a combination of a low-softening point resin and a high-softening point resin as a resin binder, melt viscosity of the low-softening point resin greatly contributes to dispersibility of an additive. Therefore, they have found that in a toner containing as a resin binder a resin having a high melt viscosity though having a low softening point, wherein the melt viscosity has smaller dependence on temperature, dispersibility of various additives are improved. The present invention has been accomplished thereby.

The toner for electrophotography of the present invention contains as a resin binder at least two polyester-based resins having different softening points, that is a low-softening point polyester-based resin and a high-softening point polyester-based resin.

The softening point of the low-softening point polyester-based resin is from 80° to 120° C., preferably from 85° to 110° C., from the viewpoint of low-temperature fixing ability. The softening point of the high-softening point polyester-based resin is higher than 120° C. and 160° C. or lower, preferably from 130° to 155° C., from the viewpoint of offset resistance.

One of the significant features of the present invention resides in that the above-mentioned low-softening point polyester-based resin has a specified viscosity property as described below, though having low softening point.

Usually, the lower the softening point of a resin, the lower the molecular weight of the resin, and the lower the melt viscosity accordingly. In the present invention, however, from the viewpoint of enhancing dispersibility of additives, the viscosity at 160° C. of the low-softening point polyester-based resin is from 500 to 10000 Pa·s, preferably from 700 to 9000 Pa·s, more preferably from 900 to 8000 Pa·s.

Also, if the melt viscosity of the resin greatly varies with change in temperature, the viscosity is partially lowered and the homogeneity is lost during melt-kneading. Therefore, the ratio of the viscosity at 140° C. to the viscosity at 180° C. (viscosity at 140° C./viscosity at 180° C.) is 10 or less, preferably from 3 to 9, more preferably from 4 to 8.

The polyester-based resin in the present invention contains a resin containing a polyester component, that is, not only a polyester per se but also a modified resin thereof. The modified resin of the polyester includes, for instance, a polyurethane-modified polyester-based resin which is a polyester modified with a urethane bond, an epoxy-modified polyester-based resin which is a polyester modified with an epoxy bond, and a hybrid resins having two or more resin components including a polyester component. As the hybrid resin, for instance, a resin disclosed in Japanese Patent Laid-Open No. Hei 7-98517, in which a polyester and an addition polymerization resin such as a vinyl polymer-based resin are partially chemically bonded to each other, is preferable. The hybrid resin may be obtained by using two or more resins as raw materials, or the hybrid resin may be obtained by using a mixture of one resin and raw material monomers for the other resin. In order to efficiently obtain a hybrid resin, those obtained from a mixture of raw material monomers of two or more resins are preferable.

The polyester and a modified resin thereof may be used alone or in combination. It is preferable that both of the low-softening point polyester-based resin and the high-softening point polyester-based resin are polyesters.

Each of the polyester components in the low-softening point polyester-based resin and the high-softening point polyester-based resin is obtained by the polycondensation of an alcohol component containing a dihydric or higher polyhydric alcohol and a carboxylic acid component containing a dicarboxylic or higher polycarboxylic acid compound as raw material monomers. Particularly, the viscosity of the low-softening point polyester-based resin can be adjusted by selection of a monomer composition or a combined use with a plasticizer, as described below.

The dihydric alcohol includes aromatic diols such as an alkylene oxide adduct of bisphenol A, represented by the formula (I):

(I)

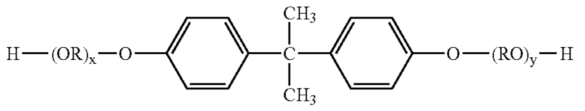

wherein R is an alkylene group having 2 or 3 carbon atoms; each of x and y is a positive number, wherein a sum of x and y is from 1 to 16, preferably from 1.5 to 5.0, such as polyoxypropylene(2.2)-2,2-bis(4-hydroxyphenyl) propane and polyoxyethylene(2.2)-2,2-bis(4-hydroxyphenyl)propane; aliphatic diols such as ethylene glycol, 1,2-propylene glycol, 1,4-butanediol, neopentyl glycol, polyethylene glycol and polypropylene glycol; hydrogenated bisphenol A; and the like.

The trihydric or higher polyhydric alcohol includes, for instance, sorbitol, pentaerythritol, glycerol, trimethylolpropane, and the like.

Also, the dicarboxylic acid compound includes aromatic dicarboxylic acids such as phthalic acid, isophthalic acid and terephthalic acid; aliphatic dicarboxylic acids such as oxalic acid, malonic acid, maleic acid, fumaric acid, citraconic acid, itaconic acid, glutaconic acid, succinic acid, adipic acid, a substituted succinic acid of which substituent is an alkyl group having 1 to 20 carbon atoms or an alkenyl group having 2 to 20, preferably 8 to 16 carbon atoms, such as dodecenylsuccinic acid and octylsuccinic acid; anhydrides thereof, alkyl(1 to 3 carbon atoms) esters thereof; and the like.

The tricarboxylic or higher polycarboxylic acid compound includes, for instance, 1,2,4-benzenetricarboxylic acid (trimellitic acid), 2,5,7-naphthalenetricarboxylic acid, pyromellitic acid, acid anhydrides thereof, alkyl(1 to 3 carbon atoms) esters thereof, and the like.

Further, as long as the effects of the present invention are not impaired, the alcohol component and/or the carboxylic acid component may contain a monohydric alcohol or monocarboxylic acid compound in a proper amount, from the viewpoint of molecular weight adjustment and the like.

The polyester component can be prepared, for instance, by polycondensing raw material monomers composed of the alcohol component and the carboxylic acid component at 150° to 280° C., preferably 200° to 250° C., in an inert gas atmosphere in the presence of an esterification catalyst as occasion demands.

There are two embodiments in the low-softening point polyester-based resin in the present invention. A first embodiment is a linear polyester-based resin, which contains a polyester component made from a raw material monomer containing 1 to 30% by mol of a divalent aliphatic monomer.

In the present invention, it is preferable that the raw material monomers for the polyester component of the low-softening point polyester-based resin contain a divalent aliphatic monomer, that is, an aliphatic diol and/or an aliphatic dicarboxylic acid compound, preferably an aliphatic dicarboxylic acid compound, more preferably a substituted succinic acid of which substituent is an alkenyl group, from the viewpoint of lowering the softening point of the polyester and increasing the molecular weight of the polyester. The content of the divalent aliphatic monomer is from 1 to 30% by mol, preferably from 2 to 15% by mol, in the raw material monomers for the polyester component. In the present invention, the content in the raw material monomers for the polyester component refers to the content in the entire raw material monomers for the polyester component, including the alcohol component and the carboxylic acid component.

Generally, the ratio of viscosity at 140° C. to viscosity at 180° C. for the linear polyester-based resin tends to be larger than that for the cross-linked polyester-based resin. In addition, from the viewpoint of the softening point, the ratio of viscosity is smaller at lower temperatures when the softening point of the resin is 120° C. or lower, and at high temperatures when the softening point is 140° C. or higher. When the softening point is from 120° to 140° C., the ratio of viscosity is likely to be large. The ratio of viscosity can be further adjusted by taking into consideration the above-mentioned monomer composition and the like.

On the other hand, the content of the divalent aromatic monomer, that is, a dihydric aromatic diol and/or a divalent aromatic dicarboxylic acid compound, is preferably from 70 to 99% by mol, more preferably from 85 to 98% by mol, of the raw material monomers for the polyester component, from the viewpoint of securing excellent triboelectric chargeability. In particular, the content of the alkylene oxide adduct of bisphenol A represented by the above-mentioned formula (I) is preferably from 80 to 100% by mol, more preferably 100% by mol, of the alcohol component.

In addition, a second embodiment of the low-softening point polyester-based resin is a low-softening point polyester-based resin wherein the low-softening point polyester-based resin is prepared by mixing a linear polyester-based resin which contains a polyester component made from a raw material monomer containing 1% by mol or less of a divalent aliphatic monomer, with a plasticizer at 130° to 210° C. Specifically, since a linear polyester-based resin is mixed with a plasticizer, the softening point can be lowered without decreasing the molecular weight of the polyester-based resin. Therefore, a polyester-based resin having a suitable molecular weight is formulated with a plasticizer, whereby a resin having an appropriate melt viscosity with a small dependency of the melt viscosity on temperature can be prepared.

As to the linear polyester-based rein to be mixed with a plasticizer, it is not necessary to adjust the softening point by the monomer composition. The content of the divalent aliphatic monomer is 1% by mol or less, preferably 0% by mol, in the raw material monomers for the polyester component.

The softening point of the polyester before mixing with a plasticizer is preferably from 90° to 140° C., more preferably from 105° to 130° C. In the present invention, the softening point of the resin during the preparation of the polyester is determined by the ring and ball method according to JIS K2531.

In the present invention, the plasticizer is a compound which is capable of lowering the softening point of the polyester-based resin preferably by 5° to 50° C., more preferably by 5° to 20° C., and has a function of mainly improving the low-temperature fixing ability of the toner. The plasticizer includes low-molecular weight plasticizers having a molecular weight of preferably from 100 to 1000, such as polyalkyl polycarboxylates, fatty acid esters, higher fatty acids, higher alcohols, fatty acid amides, paraffins and phosphoric acid esters, and high-molecular weight plasticizers having a number-average molecular weight of preferably from 1000 to 100000. Among them, alkyl carboxylate plasticizers such as polyalkyl polycarboxylates and fatty acid esters are preferable. These plasticizers may be used alone or in admixtures of two or more kinds.

The polyalkyl polycarboxylates include alkyl aromatic polycarboxylates (preferably dicarboxylic or tricarboxylic) such as trialkyl trimellitates and dialkyl phthalates; and alkyl aliphatic polycarboxylates such as dialkyl adipates; and the like. Among them, alkyl aromatic polycarboxylates are preferable, and trialkyl trimellitates are more preferable. Also, the fatty acid ester includes an alkyl ester of a fatty acid having 12 to 20 carbon atoms, and the like. The alkyl group of the alkyl ester has preferably from 1 to 18 carbon atoms, more preferably from 4 to 12 carbon atoms.

The high-molecular weight plasticizer includes polyesters, epoxy resins, terpene resins, rosin resins, and the like. Among them, polyesters are preferable, and crystalline polyesters are more preferable. In the present invention, the term "crystalline resin" refers to a resin having a ratio of the softening point to the maximum peak temperature of heat of fusion (softening point/peak temperature) of from 0.6 to 1.3, preferably from 0.9 to 1.2, more preferably from 0.95 to 1.1. The crystalline polyester is preferably a resin obtained by polycondensing an alcohol component containing 80% by mol or more of an aliphatic diol having 2 to 6 carbon atoms, preferably 4 to 6 carbon atoms, and a carboxylic acid component containing 80% by mol or more of an aliphatic dicarboxylic acid compound having 2 to 8 carbon atoms, preferably 4 to 6 carbon atoms, more preferably 4 carbon atoms. The number-average molecular weight of the high-molecular weight plasticizer is preferably from 3000 to 50000, more preferably from 4000 to 10000.

The content of the plasticizer is preferably from 1 to 30 parts by weight based on 100 parts by weight of the linear polyester-based resin as a raw material for the low-softening point polyester-based resin. Particularly, in the case of the low-molecular weight plasticizer, the content of the plasticizer is more preferably from 1 to 10 parts by weight, even more preferably from 1 to 5 parts by weight, and in the case of the high molecular weight plasticizer, the content of the plasticizer is more preferably from 10 to 20 parts by weight.

The temperature for mixing the linear polyester-based resin and the plasticizer is from 130° to 210° C., preferably from 150° to 195° C., more preferably from 170° to 190° C., from the viewpoint of prevention of the transesterification of the polyester and adjustment of the viscosity.

The mixing time is from 0.5 to 20 hours, preferably from 1 to 10 hours, more preferably from 1 to 5 hours, from the viewpoint of prevention of the transesterification of the polyester and adjustment of the viscosity.

The process for mixing of the linear polyester-based resin and the plasticizer is not particularly limited, and the mixing may be carried out with a mixer such as a kneader or an extruder. In the present invention, from the viewpoint of stable mixing of a large amount of a molten resinous liquid having a low viscosity, a process including the steps of preparing a polyester-based resin; temperature-controlling the resin in a vessel, specifically a vessel equipped with a dehydration tube, a stirrer and the like, in which the polycondensation is carried out; and adding a plasticizer thereto and mixing the plasticizer with the polyester-based resin, is preferable.

On the other hand, as the raw material monomers for the polyester component of the high-softening point polyester-based resin, a monomer for lowering the softening point is not essential. From the viewpoint of taking triboelectric chargeability seriously, the content of the divalent aliphatic monomer is preferably 1% by mol or less, more preferably 0% by mol, of the entire raw material monomers. Also, the content of the alkylene oxide adduct of bisphenol A represented by the above-mentioned formula (I) is preferably from 80 to 100% by mol, more preferably 100% by mol, of the alcohol component. The content of the aromatic dicarboxylic acid compound is preferably from 80 to 100% by mol, more preferably 100% by mol, of the dicarboxylic acid compound.

The glass transition temperature of each of the low-softening point polyester-based resin and the high-softening point polyester-based resin is preferably from 0° to 80° C., from the viewpoint of storage stability. The glass transition temperature of the low-softening point polyester-based resin is more preferably from 40° to 55° C., and the glass transition temperature of the high-softening point polyester-based resin is more preferably from 55° to 70° C. The glass transition temperature is a property inherently owned by the amorphous resin.

In addition, it is preferable that the low-softening point polyester-based resin is a linear polyester-based resin from the viewpoint of low-temperature fixing ability, and that the high-softening point polyester-based resin is preferably a nonlinear polyester-based resin from the viewpoint of offset resistance. In the present invention, the linear polyester-based resin refers to those having a content of the trivalent or higher monomer, that is, a trihydric or higher polyol and/or a tricarboxylic or higher polycarboxylic acid compound, of less than 1% by mol, preferably 0% by mol, of the raw material monomers for the polyester component. The nonlinear polyester refers to those having a content of the trivalent or higher monomer, preferably a tricarboxylic or higher polycarboxylic acid compound of from 1 to 20% by mol, preferably from 5 to 15% by mol, of the raw material monomers for the polyester component.

The weight ratio of the low-softening point polyester-based resin to the high-softening point polyester-based resin is from 20/80 to 90/10, preferably from 30/70 to 60/40, from the viewpoint of low-temperature fixing ability and offset resistance.

In the present invention, as long as the effects of the present invention are not impaired, a resin other than the above-mentioned high-softening point polyester-based resin and the above-mentioned low-softening point polyester-based resin, for instance, a styrene-acrylic resin, an epoxy resin, a polycarbonate, a polyurethane, and the like may be contained as a resin binder. The total content of the above-mentioned high-softening point polyester-based resin and the above-mentioned low-softening point polyester-based resin is preferably from 50 to 100% by weight, more preferably from 80 to 100% by weight, even more preferably 100% by weight of the resin binder.

Further, the toner of the present invention may appropriately contain an additive such as a colorant, a releasing agent, a charge control agent, a magnetic powder, an electric conductivity modifier, an extender, a reinforcing filler such as a fibrous substance, an antioxidant, an anti-aging agent, a fluidity improver, or a cleanability improver.

As the colorant, all of the dyes, pigments and the like which are used as colorants for toners can be used, and the colorant includes carbon blacks, Phthalocyanine Blue, Permanent Brown FG, Brilliant Fast Scarlet, Pigment Green B, Rhodamine-B Base, Solvent Red 49, Solvent Red 146, Solvent Blue 35, quinacridone, carmine 6B, disazoyellow, and the like. These colorants can be used alone or in admixture of two or more kinds. The toner of the present invention may be any of black toner, color toner and full-color toner. The content of the colorant is preferably from 1 to 40 parts by weight, more preferably from 3 to 10 parts by weight, based on 100 parts by weight of the resin binder.

The releasing agent includes polyolefin waxes such as polypropylene waxes, polyethylene waxes and polypropylene-polyethylene copolymer waxes; ester waxes such as carnauba wax, haze wax, beeswax, spermaceti wax, and montan wax; amide waxes such as fatty acid amide waxes; and the like. Among these waxes, polyolefin waxes are preferable. Usually, polyolefin waxes are known to have high hardness and high durability, while they have a large difference in SP (solubility parameter) from that for polyester, so that dispersibility in a polyester is poor. In the present invention, however, even such polyolefin waxes are excellently dispersed in a polyester.

The content of the polyolefin wax is preferably from 50% by weight or more, more preferably from 80 to 100% by weight, even more preferably 100% by weight, of the total weight of the releasing agent.

The melting point of the releasing agent is preferably from 60° to 120° C., more preferably from 90° to 120° C., from the viewpoint of offset resistance and durability.

The content of the releasing agent is preferably from 0.1 to 5 parts by weight, more preferably from 0.5 to 3 parts by weight, based on 100 parts by weight of the resin binder.

The charge control agent includes positively chargeable charge control agents such as Nigrosine dyes, triphenylmethane-based dyes containing a tertiary amine as a side chain, quaternary ammonium salt compounds, polyamine resins and imidazole derivatives, and negatively chargeable charge control agents such as metal-containing azo dyes, copper phthalocyanine dyes, metal complexes of alkyl derivatives of salicylic acid and boron complexes of benzilic acid.

The content of the charge control agent is preferably from 0.1 to 5 parts by weight, more preferably from 0.5 to 2 parts by weight, based on 100 parts by weight of the resin binder.

The magnetic powder includes ferromagnetic metals such as cobalt, iron and nickel; alloys made of metals such as cobalt, iron, nickel, aluminum, lead, magnesium, zinc and manganese; metal oxides such as $Fe_3O_4$, $\gamma$—$Fe_3O_4$ and cobalt-containing iron oxides; various ferrites such as Mn—Zn ferrite and Ni—Zn ferrite; magnetite and hematite; and the like. Further, the surface of the magnetic powder may be treated with a surface treatment agent such as a silane coupling agent or a titanate coupling agent, or coated with a polymer.

The average primary particle size of the magnetic powder is preferably from 0.05 to 0.5 μm, more preferably from 0.1 to 0.3 μm, from the viewpoint of dispersibility.

Generally, magnetic powders have low dispersibility in a resin. When dispersion of a magnetic powder is inhomogeneous, the triboelectric chargeability of the toner is likely to be lowered. In the present invention, however, since the lowering of dispersibility can be suppressed even with a magnetic powder, the toner of the present invention more remarkably exhibits such an effect in the case of a magnetic toner containing a magnetic powder.

In the case of a magnetic toner, the content of the magnetic powder, as expressed by a weight ratio of resin binder/magnetic powder, is preferably from 80/20 to 30/70, more preferably from 50/50 to 70/30. The magnetic powder may be used as a black colorant.

The process for preparing the toner may be any of conventionally known methods such as a kneading-pulverization method, an emulsion phase-inversion method, an emulsification-dispersion method and a suspension polymerization method, and the kneading and pulverization method is preferable because the toner is prepared easily. For instance, in a case of a pulverized toner prepared by the kneading and pulverization method, the toner can be prepared by homogeneously mixing a resin binder, a colorant, and the like in a mixer such as a Henschel mixer, thereafter melt-kneading with a closed kneader, a single-screw or twin-screw extruder or the like, cooling, pulverizing and classifying the product. The weight-average particle size of the toner is preferably from 3 to 15 μm.

The toner containing the resin binder obtained by the present invention can be used as any of a toner for monocomponent development and a toner for two component development. The effect of the present invention is exhibited particularly in the case where the toner of the present invention is used as a toner for monocomponent development in which a toner is charged by single friction with a blade or the like, as compared to the case used as a toner for two component development in which the charge can be controlled with a carrier. Therefore, the toner of the present invention is more preferably a toner for magnetic monocomponent development.

EXAMPLES

The following examples further describe and demonstrate embodiments of the present invention. The examples are given solely for the purposes of illustration and are not to be construed as limitations of the present invention.

[Softening Point of Resin After Termination of Reaction]

Softening point refers to a temperature corresponding to h/2 of the height (h) of the S-shaped curve showing the relationship between the downward movement of a plunger (flow length) and temperature, namely, a temperature at which a half of the resin flows out, when measured by using a "koka" type flow tester (commercially available from Shimadzu Corporation, CFT-500) in which a 1 g sample is extruded through a nozzle having a dice pore size of 1 mm and a length of 1 mm, with heating the sample at a heating rate of 6° C./min and applying a load of 1.96 MPa thereto with the plunger.

[Viscosity of Resin]

The viscosity is determined at each temperature with a viscoelastometer (rheometer), Model: RDA-II (commercially available from Rheometric Scientific F. E. Ltd.) under the following determination conditions at intervals of 10° C. from 180° to 140° C. is used.

(Determination Conditions)

Jig: Parallel Plate (radius: 5 mm)
Sample: 1 g
Frequency: 2 radian/sec
Strain: 2°

[Maximum Peak Temperature of Heat of Fusion and Glass Transition Temperature of Resin, and Melting Point of Wax]

The maximum peak temperature of heat of fusion is determined using a differential scanning calorimeter (commercially available from Seiko Instruments, Inc., DSC 210), by raising its temperature to 200° C., cooling the hot sample from this temperature to 0° C. at a cooling rate of 10° C./min., and thereafter heating the sample so as to raise the temperature at a rate of 10° C./min. Incidentally, the maximum peak temperature in a wax is referred to as a melting point. In addition, the glass transition temperature refers to the temperature of an intersection of the extension of the baseline of equal to or lower than the maximum peak temperature and the tangential line showing the maximum inclination between the kick-off of the peak and the top of the peak by the determination mentioned above for an amorphous resin.

RESIN PREPARATION EXAMPLE 1 (RESIN O, RESINS A TO E)

A 5-liter four-necked flask equipped with a nitrogen inlet tube, a dehydration tube, a stirrer, and a thermocouple was charged with the raw material monomers as shown in Table 1 and 4 g of dibutyltin oxide, and the ingredients were reacted at 230° C. over a period of 12 hours. Thereafter, the ingredients were reacted at 8.3 kPa until the desired softening point was attained.

TABLE 1

| | Resin O | Resin A | Resin B |
|---|---|---|---|
| BPA-PO[1] | 700 g (20) | 1750 g (50) | — |
| BPA-EO[2] | 2600 g (80) | 1625 g (50) | 3250 g (100) |
| Terephthalic Acid | 1328 g (80) | 830 g (50) | 996 g (60) |
| Dodecenylsuccinic Anhydride | 268 g (10) | 1340 g (50) | — |
| Trimellitic Acid | — | — | — |
| Fumaric Acid | — | — | 441 g (38) |
| Softening Point (° C.) | 98.6 | 96.2 | 99.4 |
| Glass Transition Temperature (° C.) | 54.1 | 50.3 | 52.1 |
| Viscosity at 160° C. (Pa · s) | 1060 | 7250 | 850 |
| Viscosity Ratio [140° C./180° C.] | 6.1 | 6.5 | 6.9 |

TABLE 1-continued

| | Resin C | Resin D | Resin E |
|---|---|---|---|
| BPA-PO[1] | 3150 g (90) | 3500 g (100) | 3500 g (100) |
| BPA-EO[2] | 325 g (10) | — | — |
| Terephthalic Acid | 1411 g (85) | 1627 g (98) | 1328 g (80) |
| Dodecenylsuccinic Anhydride | — | — | — |
| Trimellitic Acid | — | — | 232 g (20) |
| Fumaric Acid | — | — | — |
| Softening Point (° C.) | 103.5 | 118.3 | 146.3 |
| Glass Transition Temperature (° C.) | 61.2 | 68.9 | 67.5 |
| Viscosity at 160° C. (Pa · s) | 350 | 1150 | 12030 |
| Viscosity Ratio [140° C./180° C.] | 7.2 | 15.7 | 4.6 |

Note)
The values in parentheses are expressed by molar ratios.
[1]Polyoxypropylene(2.2)-2,2-bis(4-hydroxyphenyl)propane
[2]Polyoxyethylene(2.2)-2,2-bis(4-hydroxyphenyl)propane

RESIN PREPARATION EXAMPLE 2 (RESIN F)

A 5-liter four-necked flask equipped with a nitrogen inlet tube, a dehydration tube, a stirrer, and a thermocouple was charged with the raw material monomers as shown in Table 2 and 4 g of dibutyltin oxide, and the ingredients were reacted at 230° C. over a period of 12 hours. Thereafter, the ingredients were reacted at 8.3 kPa for 1 hour. The softening point at this point, as determined by the ring and ball method, was 122.1° C.

After the temperature of the reaction phase was decreased to 180° C., tri(2-ethylhexyl) trimellitate was added as a plasticizer, and the reaction mixture was stirred at normal pressure for 1 hour, and then at 8.3 kPa for 2 hours. Thereafter, the softening point was determined by the ring and ball method. As a result, the softening point of the resin was 105.4° C. The resin obtained was taken out from the flask, and cooled.

TABLE 2

| | Resin F | Resin G |
|---|---|---|
| BPA-PO[1] | 1750 g (50) | — |
| BPA-EO[2] | 1625 g (50) | 3250 g (100) |
| Terephthalic Acid | 1527 g (92) | 1610 g (97) |
| Tri(2-ethylhexyl) Trimellitate | 150 g (3) | — |
| Crystalline Polyester a | — | 900 g |
| Softening Point (° C.) | 101.2 | 98.8 |
| Glass Transition Temperature (° C.) | 54.2 | 48.5 |
| Viscosity at 160° C. (Pa · s) | 1030 | 1560 |
| Viscosity Ratio [140° C./180° C.] | 9.5 | 7.3 |

Note)
The values in parentheses are expressed by molar ratios.
[1]Polyoxypropylene(2.2)-2,2-bis(4-hydroxyphenyl)propane
[2]Polyoxyethylene(2.2)-2,2-bis(4-hydroxyphenyl)propane

RESIN PREPARATION EXAMPLE 3 (RESIN G)

A 5-liter four-necked flask equipped with a nitrogen inlet tube, a dehydration tube, a stirrer and a thermocouple was charged with the raw material monomers as shown in Table 3, 4 g of dibutyltin oxide and 1 g of hydroquinone, and the ingredients were reacted at 160° C. over a period of 5 hours. Thereafter, the temperature was raised to 200° C., and the ingredients were reacted for 1 hour and further reacted at 8.3 kPa until a resin having the desired viscosity was obtained, to give a crystalline polyester a.

The same procedures as in Resin Preparation Example 2 were carried out using the raw material monomers as shown in Table 2 and 4 g of dibutyltin oxide, and using the crystalline polyester a in place of tri(2-ethylhexyl) trimellitate, to give a resin. The softening point of before adding the crystalline polyester a, as determined by the ring and ball method, was 120.1° C.

TABLE 3

| | Crystalline Polyester a |
|---|---|
| 1,6-Hexanediol | 2407 g (102) |
| Fumaric Acid | 2320 g (100) |
| Softening Point (° C.) | 116.3 |
| Maximum Peak Temperature (° C.) of Heat of Fusion | 112.4 |
| Viscosity at 160° C. (Pa · s) | 1210 |
| Viscosity Ratio [140° C./180° C.] | 4.3 |

Note)
The values in parentheses are expressed by molar ratios.

EXAMPLES 1 TO 6 AND COMPARATIVE EXAMPLES 1 TO 3

The resin binder as shown in Table 4 and 66 parts by weight of a magnetic powder "MTS 106 HD" (commercially available from Toda Kogyo Corp.), 0.5 parts by weight of a charge control agent "T-77" (commercially available from Hodogaya Chemical Co., Ltd.), and 1 part by weight of a polyethylene wax "SP-105" (commercially available from Sazol, melting point: 105° C.) were sufficiently mixed with a Henschel mixer. Thereafter, the mixture was melt-kneaded using a co-rotating twin-screw extruder having an entire length of the kneading portion of 1560 mm, a screw diameter of 42 mm and a barrel inner diameter of 43 mm. The heating temperature within the roller was 140° C., the rotational speed of the roller was 150 r/min., the feeding rate of the mixture was 20 kg/h, and the average residence time was about 18 seconds.

The resulting melt-kneaded product was rolled with a chill roll, mechanically pulverized, and classified, to give a powder having a weight-average particle size of 6 μm (used in Test Example 2 below).

Two parts by weight of a hydrophobic silica "R-972" (commercially available from Nippon Aerosil) and 1 part by weight of strontium titanate "ST" (commercially available from Fuji Titanium Industry Co., Ltd., average primary particle size: 0.97 μm) were added as external additives to 100 parts by weight of the resulting powder, and mixed with a Henschel mixer, to give a magnetic toner.

TEST EXAMPLE 1

Two-hundred and fifty grams of the magnetic toner was loaded in an apparatus for magnetic monocomponent development "Laser Jet 4200" (commercially available from Hewlett Packard), and an unfixed image (2 cm×12 cm) with an amount of toner adhered of 0.6 mg/cm$^2$ was obtained.

The unfixed image obtained was subjected to a fixing test with a fixing device (fixing speed: 200 mm/sec) in a copy machine "AR-505" (commercially available from Sharp Corporation) which was modified to enable fixing of the unfixed image off-line, while sequentially raising the temperature from 100° to 240° C. in increments of 10° C.

A "UNICEF Cellophane" (commercially available from MITSUBISHI PENCIL CO., LTD., width: 18 mm, JIS Z-1522) was adhered to each of the images fixed at each temperature, and passed through a fixing roller set at 30° C., and thereafter the tape was stripped away. The optical reflective densities of the image before adhesion of the tape and after strip-away of the tape were measured with a reflective densitometer "RD-915" (commercially available from Macbeth Process Measurements Co.). The temperature of the fixing roller at which the ratio of the optical densities (after strip-away of the tape/before adhesion of the tape) initially exceeds 90% is defined as the lowest fixing temperature. The low-temperature fixing ability was evaluated according to the following evaluation criteria. The results are shown in Table 4.

[Evaluation Criteria]

⊚: Lowest fixing temperature being lower than 190° C.;

○: Lowest fixing temperature being from 190° to 240° C.; and x: Lowest fixing temperature being higher than 240° C.

TEST EXAMPLE 2

Four parts by weight of a toner before addition of an external additive and 96 parts by weight of a silicone-coated ferrite carrier having an average particle size of 90 μm (commercially available from Kanto Denka Kogyo Co., Ltd.) were determined with a ball-mill for 10 minutes, and the triboelectric charges were determined with a "q/m Meter MODEL 210HS" (commercially available from TREK). The results are shown in Table 4.

TEST EXAMPLE 3

Two-hundred and fifty grams of the magnetic toner was loaded in an apparatus for magnetic monocomponent development "Laser Jet 4200" (commercially available from Hewlett Packard), and left under the environment of a temperature of 30° C. and a relative humidity of 85% for 12 hours. Thereafter, a printing was carried out under the same environment for 500 sheets of images having a printing ratio of 5%. An image density (optical reflective density) was determined every 50 sheets of printouts for a total of 10 times with a reflective densitometer "RD-915" (commercially available from Macbeth Process Measurements Co.), and stability in image densities was evaluated according to the following evaluation criteria. The results are shown in Table 4.

TABLE 4

| | Resin Binder | Low-Temperature Fixing Ability | Triboelectric Charges (μC/g) | Stability in Image Density |
|---|---|---|---|---|
| Ex. 1 | Resin O/Resin E = 50/50 | ⊚ | −15.8 | ⊚ |
| Ex. 2 | Resin A/Resin E = 50/50 | ⊚ | −16.3 | ⊚ |
| Ex. 3 | Resin B/Resin E = 50/50 | ⊚ | −12.7 | ○ |
| Ex. 4 | Resin F/Resin E = 50/50 | ⊚ | −15.7 | ⊚ |
| Ex. 5 | Resin O/Resin E = 30/70 | ○ | −16.2 | ⊚ |
| Ex. 6 | Resin G/Resin E = 50/50 | ⊚ | −14.0 | ○ |
| Comp. Ex. 1 | Resin C/Resin E = 50/50 | ⊚ | −6.8 | X |
| Comp. Ex. 2 | Resin D/Resin E = 50/50 | ○ | −7.5 | X |
| Comp. Ex. 3 | Resin B/Resin E = 10/90 | X | −15.8 | ⊚ |

Note)
The amounts of the resin binders used are expressed in parts by weight.
[Evaluation Criteria]

TABLE 4-continued

| Resin Binder | Low-Temperature Fixing Ability | Triboelectric Charges (μC/g) | Stability in Image Density |
|---|---|---|---|

⊚: The 8th to the 10th image densities being within the range of 1.4 ± 0.1;
○: The 3rd to the 7th image densities being within the range of 1.4 ± 0.1; and
X: The 1st to the 2nd image densities being within the range of 1.4 ± 0.1.

It is can be seen from the above results that all of the toners of the Examples 1 to 6 are satisfactory in low-temperature fixing ability, excellent in triboelectric charges and stability in image density. On the other hand, it can be seen from the above results that the toners of Comparative Examples 1 and 2 containing a resin which does not have the desired viscosity property are insufficient in triboelectric chargeability, and the toner of Comparative Example 3 containing a large amount of a high-softening point resin is insufficient in low-temperature fixing ability.

The toner for electrophotography of the present invention can be used for, for instance, developing electrostatic latent images formed in electrophotography, electrostatic recording method, electrostatic printing method, or the like.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A toner for electrophotography, comprising:

a low-softening point polyester-based resin having a softening point of from 80° to 120° C.; and a high-softening point polyester-based resin having a softening point of higher than 120° C. and 160° C. or lower, wherein (i) the low-softening point polyester-based resin is a linear polyester-based resin comprising from 1 to 30% by mol of reacted units of a dodecenyl substituted succinic acid compound, (ii) the low-softening point polyester-based resin has a viscosity at 160° C. of from 500 to 10000 Pa·s, and a ratio of viscosity at 140° C. to viscosity at 180° C. is 10 or less, and wherein a weight ratio of the low-softening point polyester-based resin to the high-softening point polyester-based resin is from 20/80 to 90/10, wherein the low-softening point polyester-based resin comprises reacted units of dodecenyl succinic anhydride. terephthalic acid, polyoxypropylene(2.2)-2,2-bis(4-hydroxyphenyl)propane and polyoxyethylene(2.2)-2,2-bis(4-hydroxyphenyl)propane.

2. The toner according to claim 1, wherein the high-softening point polyester-based resin is a non-linear polyester-based resin which comprises a polyester component made from a raw material monomer containing 1% by mol or less of a divalent aliphatic monomer.

3. The toner according to claim 1, wherein the high-softening point polyester-based resin is a non-linear polyester-based resin which comprises a polyester component made from a raw material monomer containing an alkylene oxide adduct of bisphenol A, represented by the formula (I):

(I)

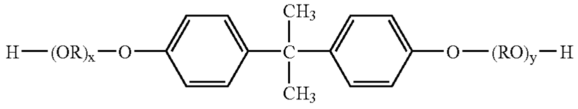

wherein R is an alkylene group having 2 or 3 carbon atoms; each of x and y is a positive number, wherein a sum of x and y is from 1 to 16.

4. The toner according to claim 1, wherein both of the low-softening point polyester-based resin and the high-softening point polyester-based resin are polyesters.

5. The toner according to claim 1, wherein the toner is a magnetic monocomponent toner.

6. The toner according to claim 1, wherein the low-softening point polyester-based resin has a glass transition temperature of from 50.3 to 54.1° C.

7. The toner according to claim 1, wherein the low-softening point polyester-based resin has a ratio of viscosity at 140° C. to viscosity at 180° C. of from 6.1 to 6.9.

* * * * *